United States Patent

Tsunoda

(10) Patent No.: US 7,611,992 B2
(45) Date of Patent: Nov. 3, 2009

(54) SEMICONDUCTOR LIGHT EMITTING ELEMENT AND METHOD OF MANUFACTURING THE SAME

(75) Inventor: Atsuo Tsunoda, Higashihiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/942,316

(22) Filed: Nov. 19, 2007

(65) Prior Publication Data

US 2008/0116472 A1 May 22, 2008

(30) Foreign Application Priority Data

Nov. 21, 2006 (JP) ............... 2006-314052

(51) Int. Cl.
*H01L 21/306* (2006.01)
(52) U.S. Cl. ............... 438/704; 257/E21.229; 438/42
(58) Field of Classification Search ............ 438/71, 438/72, 33, 39, 40, 42, 43, 704; 257/E21.229
See application file for complete search history.

(56) References Cited

U.S. PATENT DOCUMENTS

| 6,441,403 | B1 | 8/2002 | Chang et al. | |
|---|---|---|---|---|
| 6,878,563 | B2 | 4/2005 | Bader et al. | |
| 2002/0139987 | A1* | 10/2002 | Collins et al. | 257/88 |
| 2004/0077114 | A1* | 4/2004 | Coman et al. | 438/46 |
| 2004/0245543 | A1* | 12/2004 | Yoo | 257/103 |
| 2004/0256631 | A1* | 12/2004 | Shin | 257/99 |
| 2005/0040413 | A1* | 2/2005 | Takahashi et al. | 257/96 |
| 2005/0180478 | A1* | 8/2005 | Sakamoto et al. | 372/50.1 |
| 2005/0242365 | A1* | 11/2005 | Yoo | 257/103 |
| 2006/0006398 | A1* | 1/2006 | Hata | 257/94 |
| 2006/0189017 | A1* | 8/2006 | Nogami | 438/46 |
| 2006/0226434 | A1* | 10/2006 | Hata | 257/94 |
| 2007/0037307 | A1* | 2/2007 | Donofrio | 438/42 |
| 2008/0179623 | A1* | 7/2008 | Tachibana et al. | 257/103 |

FOREIGN PATENT DOCUMENTS

| CN | 1719634 | 1/2006 |
|---|---|---|
| JP | 9-8403 | 1/1997 |
| JP | 2003-532298 | 10/2003 |
| JP | 2005-322919 | 11/2005 |

* cited by examiner

*Primary Examiner*—David Vu
*Assistant Examiner*—Earl N Taylor
(74) *Attorney, Agent, or Firm*—Morrison & Foerster LLP

(57) ABSTRACT

A semiconductor light emitting element including a conductive substrate, a bonding metal layer formed on the conductive substrate, a barrier layer formed on the bonding metal layer, a reflective layer formed on the barrier layer, an ohmic electrode layer formed on the reflective layer, a second conductivity type semiconductor layer formed on the ohmic electrode layer, a light emitting layer formed on the second conductivity type semiconductor layer, and a first conductivity type semiconductor layer formed on the light emitting layer, wherein outer peripheries of the second conductivity type semiconductor layer, the light emitting layer, and the first conductivity type semiconductor layer are removed, and a method of manufacturing the same are provided.

8 Claims, 6 Drawing Sheets

SEMICONDUCTOR LIGHT EMITTING ELEMENT AND METHOD OF MANUFACTURING THE SAME

REFERENCE TO RELATED APPLICATIONS

This application claims priority from Japanese Patent Application No. 2006-314052 filed Nov. 21, 2006, the entire contents of which are incorporated herein by reference.

FIELD OF THE INVENTION

The present invention relates to a semiconductor light emitting element and a method of manufacturing the same, and more particularly to a semiconductor light emitting element capable of improving yield and a method of manufacturing the same.

BACKGROUND OF THE INVENTION

A semiconductor light emitting element having a conductive substrate attached to a semiconductor layered body as disclosed in Patent Document 1 (Japanese Patent Laying-Open No. 09-008403) is expected as an effective approach for achieving high-intensity light emission as a light emitting diode. In particular, a semiconductor light emitting element using nitride semiconductor is attracting attention as a material expected to provide light emission in a wide light wavelength band.

FIG. 12 is a schematic cross sectional view of an exemplary conventional semiconductor light emitting element having a conductive substrate attached to a semiconductor layered body.

The conventional semiconductor light emitting element has a structure in which, on a conductive substrate 102 having a first ohmic electrode layer 101 and a second ohmic electrode layer 103 formed on respective sides thereof, the following layers are stacked sequentially: a first bonding metal layer 104a; a second bonding metal layer 104b; a barrier layer 105; a reflective layer 106; a p-side ohmic electrode layer 107; a p-type semiconductor layer 108; a light emitting layer 109; an n-type semiconductor layer 110; and an n-side ohmic electrode layer 111.

The semiconductor light emitting element having such a structure is fabricated, for example, as described below. Firstly, the second ohmic electrode layer 103 and the first bonding metal layer 104a are stacked in this order on conductive substrate 102 to fabricate a first wafer. In addition, n-type semiconductor layer 110, light emitting layer 109, and p-type semiconductor layer 108 are sequentially grown on a growth substrate, and thereafter p-side ohmic electrode layer 107, reflective layer 106, barrier layer 105, and the second bonding metal layer 104b are stacked in this order to fabricate a second wafer.

Next, the first bonding metal layer 104a of the first wafer and the second bonding metal layer 104b of the second wafer are bonded to fabricate a wafer bonded body. Subsequently, the growth substrate is removed from the second wafer of the wafer bonded body. Then, the first ohmic electrode layer 101 is formed on a rear surface of conductive substrate 102, and n-side ohmic electrode layer 111 is formed on a surface of n-type semiconductor layer 110.

Thereafter, the wafer bonded body having the first ohmic electrode layer 101 and n-side ohmic electrode layer 111 formed thereon is cut into chips, and thereby the conventional semiconductor light emitting element having the structure shown in FIG. 12 is obtained.

SUMMARY OF THE INVENTION

In the conventional semiconductor light emitting element having the structure described above, however, conductive substrate 102 and the growth substrate are formed of different materials. When conductive substrate 102 and the growth substrate are formed of different materials, distortion tends to occur in the layers constituting the semiconductor light emitting element due to internal stress. Therefore, the semiconductor layers may be delaminated when the wafer bonded body is divided into chips, causing a problem of reducing yield.

In view of the above circumstances, one object of the present invention is to provide a semiconductor light emitting element capable of improving yield and a method of manufacturing the same.

The present invention is a semiconductor light emitting element including a conductive substrate, a bonding metal layer formed on the conductive substrate, a barrier layer formed on the bonding metal layer, a reflective layer formed on the barrier layer, an ohmic electrode layer formed on the reflective layer, a second conductivity type semiconductor layer formed on the ohmic electrode layer, a light emitting layer formed on the second conductivity type semiconductor layer, and a first conductivity type semiconductor layer formed on the light emitting layer, wherein outer peripheries of the second conductivity type semiconductor layer, the light emitting layer, and the first conductivity type semiconductor layer are removed.

In the present invention, another layer may be formed at least one of: (i) between the conductive substrate and the bonding metal layer; (ii) between the bonding metal layer and the barrier layer; (iii) between the barrier layer and the reflective layer; (iv) between the reflective layer and the ohmic electrode layer; (v) between the ohmic electrode layer and the second conductivity type semiconductor layer; (vi) between the second conductivity type semiconductor layer and the light emitting layer; and (vii) between the light emitting layer and the first conductivity type semiconductor layer.

Further, in the present invention, the "barrier layer" refers to a layer capable of suppressing interdiffusion of atoms between two layers sandwiching the barrier layer, when compared to a case where no barrier layer is provided.

Furthermore, in the present invention, the "reflective layer" refers to a layer capable of reflecting at least a portion of light emitted from the light emitting layer.

In the semiconductor light emitting element of the present invention, a surface thereof on a side adjacent to the first conductivity type semiconductor layer can serve as a main light extracting surface.

In the present invention, the "main light extracting surface" refers to a surface capable of extracting light emitted from the light emitting surface more than other surfaces.

Preferably, in the semiconductor light emitting element of the present invention, an insulating film is formed at least partly in a portion where the outer peripheries described above are removed.

Preferably, in the semiconductor light emitting element of the present invention, the insulating film has an opening for extracting light.

Preferably, in the semiconductor light emitting element of the present invention, an area of the opening for extracting light in the insulating film is not less than 50% and not more than 99% of an area of a surface of the conductive substrate.

Preferably, in the semiconductor light emitting element of the present invention, an area of a portion where the outer peripheries are removed is not less than 1% and not more than 50% of an area of a surface of the conductive substrate.

Preferably, in the semiconductor light emitting element of the present invention, the bonding metal layer is made of Au (gold) or an alloy containing Au.

Preferably, in the semiconductor light emitting element of the present invention, the barrier layer is made of Ni (nickel) or an alloy containing Ni.

Preferably, in the semiconductor light emitting element of the present invention, the reflective layer is made of Ag (silver) or an alloy containing Ag.

Preferably, in the semiconductor light emitting element of the present invention, the ohmic electrode layer is made of Pd (palladium) or an alloy containing Pd.

Preferably, in the semiconductor light emitting element of the present invention, unevenness is formed on a surface of the first conductivity type semiconductor layer, and the surface of the first conductivity type semiconductor layer having the unevenness formed thereon serves as a main light extracting surface.

Preferably, in the semiconductor light emitting element of the present invention, the second conductivity type semiconductor layer, the light emitting layer, and the first conductivity type semiconductor layer are made of nitride semiconductor.

In the present invention, as the nitride semiconductor, a nitride semiconductor represented, for example, by a composition formula $Al_xGa_yIn_zN$ (where $0 \leq x \leq 1, 0 \leq y \leq 1, 0 \leq z \leq 1, x+y+z \neq 0$) can be used. It is to be noted, in the above composition formula, Al represents aluminum, Ga represents gallium, In represents indium, and N represents nitrogen. Further, x represents a composition ratio of Al, y represents a composition ratio of Ga, and z represents a composition ratio of In. Further, an n-type or p-type dopant may be doped into the nitride semiconductor represented by the above composition formula.

The present invention is a method of manufacturing the semiconductor light emitting element described in any of the above descriptions, including the step of removing outer peripheries of the second conductivity type semiconductor layer, the light emitting layer, and the first conductivity type semiconductor layer by dry etching.

Preferably, in the method of manufacturing the semiconductor light emitting element of the present invention, when the reflective layer is made of Ag or an alloy containing Ag, ultrasonic cleaning is performed after the dry etching.

Preferably, in the method of manufacturing the semiconductor light emitting element of the present invention, surfaces of the second conductivity type semiconductor layer, the light emitting layer, and the first conductivity type semiconductor layer exposed by the dry etching are immersed in an etchant.

Preferably, in the method of manufacturing the semiconductor light emitting element of the present invention, an insulating film is formed on the surfaces of the second conductivity type semiconductor layer, the light emitting layer, and the first conductivity type semiconductor layer immersed in the etchant.

In the method of manufacturing the semiconductor light emitting element of the present invention, a material that can etch at least one type selected from a group consisting of the bonding metal layer, the barrier layer, the reflective layer, and the ohmic electrode layer can be used as the etchant.

Preferably, in the method of manufacturing the semiconductor light emitting element of the present invention, when the bonding metal layer is made of Au or an alloy containing Au, the etchant is formed of a mixed solution of iodine, potassium iodide, an organic solvent, and water.

Preferably, in the method of manufacturing the semiconductor light emitting element of the present invention, when the barrier layer is made of Ni or an alloy containing Ni, the etchant is formed of hydrochloric acid, sulfuric acid, or a nitric acid aqueous solution.

Preferably, in the method of manufacturing the semiconductor light emitting element of the present invention, when the reflective layer is made of Ag or an alloy containing Ag, the etchant is formed of a mixed solution of a phosphoric acid aqueous solution, a nitric acid aqueous solution, an acetic acid aqueous solution, and water.

Preferably, in the method of manufacturing the semiconductor light emitting element of the present invention, when the ohmic electrode layer is made of Pd or an alloy containing Pd, the etchant is formed of a mixed solution of hydrochloric acid and water.

According to the present invention, a semiconductor light emitting element capable of improving yield and a method of manufacturing the same can be provided.

The foregoing and other objects, features, aspects and advantages of the present invention will become more apparent from the following detailed description of the present invention when taken in conjunction with the accompanying drawings.

DETAILED DESCRIPTION OF THE INVENTION

Figure 1:
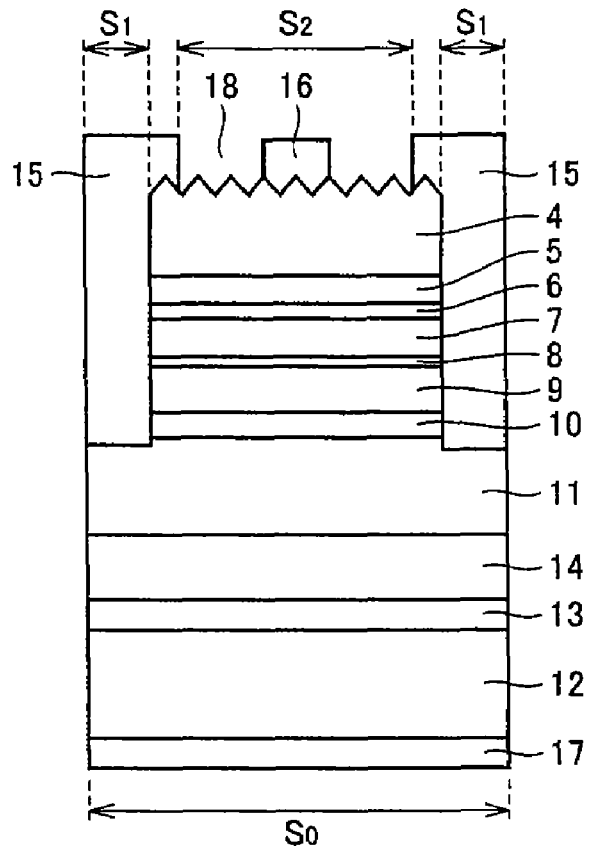
FIG. 1 is a schematic cross sectional view of an exemplary nitride semiconductor light emitting diode element that is an exemplary semiconductor light emitting element of the present invention.

Hereinafter, embodiments of the present invention will be described. In the drawings of the present invention, identical or corresponding parts will be designated by the same reference numerals.

FIG. 1 is a schematic cross sectional view of an exemplary nitride semiconductor light emitting diode element that is an exemplary semiconductor light emitting element of the present invention.

The nitride semiconductor light emitting diode element shown in FIG. 1 has a structure in which, on a conductive substrate 12 made of, for example, n-type silicon, the following layers are stacked sequentially: a second ohmic electrode layer 13 formed of, for example, a layered body of a Ti layer and an Au layer; a first bonding metal layer 14 formed of, for example, an Au—Sn alloy layer; a second bonding metal layer 11 formed of, for example, an Au layer; a barrier layer 10 formed of, for example, an Ni—Ti alloy; a reflective layer 9 formed of, for example, an Ag—Nd layer; a p-side ohmic electrode layer 8 formed of, for example, a Pd layer; a first p-type semiconductor layer 7 made of, for example, p-type GaN; a second p-type semiconductor layer 6 made of, for example, p-type AlGaN; a light emitting layer 5 including, for example, a blocking layer made of GaN and a well layer made of InGaN; and an n-type semiconductor layer 4 made of, for example, n-type GaN.

In the nitride semiconductor light emitting diode element shown in FIG. 1, n-type semiconductor layer 4 has a surface having unevenness formed thereon, and an n-side ohmic electrode layer 16 formed of, for example, a layered body of a Ti layer and an Au layer is formed on the uneven surface. Further, a first ohmic electrode layer 17 formed of a layered body of a Ti layer, an Al layer, and a Ti layer is formed on a rear surface of conductive substrate 12.

Further, in the nitride semiconductor light emitting diode element shown in FIG. 1, all the outer peripheries of n-type semiconductor layer 4, light emitting layer 5, the second p-type semiconductor layer 6, the first p-type semiconductor layer 7, p-side ohmic electrode layer 8, reflective layer 9, and barrier layer 10 and all the outer periphery of a portion of the second bonding metal layer 11 are removed.

Furthermore, in the nitride semiconductor light emitting diode element shown in FIG. 1, an insulating film 15 is formed on side surfaces of n-type semiconductor layer 4, light emitting layer 5, the second p-type semiconductor layer 6, the first p-type semiconductor layer 7, p-side ohmic electrode layer 8, reflective layer 9, and barrier layer 10 and a portion of a side surface of the second bonding metal layer 11 which are exposed by the removal of the outer peripheries described above. Insulating film 15 is provided with a square opening 18 in which n-type semiconductor layer 4 is exposed.

Hereinafter, an exemplary method of manufacturing the nitride semiconductor light emitting diode element shown in FIG. 1 will be described.

Figure 2:
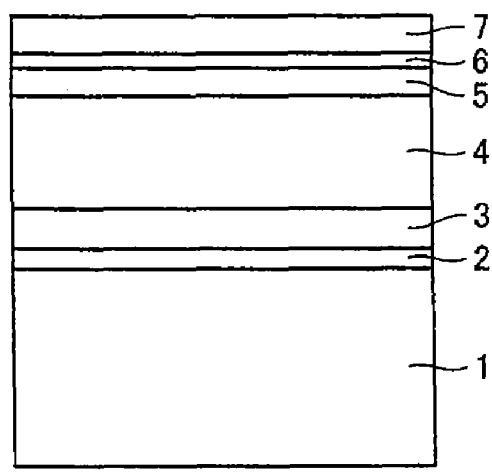
FIGS. 2 to 11 are schematic cross sectional views each showing a step of an exemplary method of manufacturing the nitride semiconductor light emitting diode element shown in FIG. 1.

Firstly, as shown in a schematic cross sectional view of FIG. 2, on a sapphire substrate 1 as a growth substrate, the following layers are stacked in an order described below by means of, for example, MOCVD (Metal Organic Chemical Vapor Deposition): a buffer layer 2 made of, for example, GaN with a thickness of, for example, 250 nm; a nitride semiconductor layer 3 made of, for example, undoped GaN with a thickness of, for example, 1 μm; n-type semiconductor layer 4 with a thickness of, for example, 4 μm; light emitting layer 5 with a thickness of, for example, 100 nm; the second p-type semiconductor layer 6 with a thickness of, for example, 30 nm; and the first p-type semiconductor layer 7 with a thickness of, for example, 200 nm.

Figure 3:
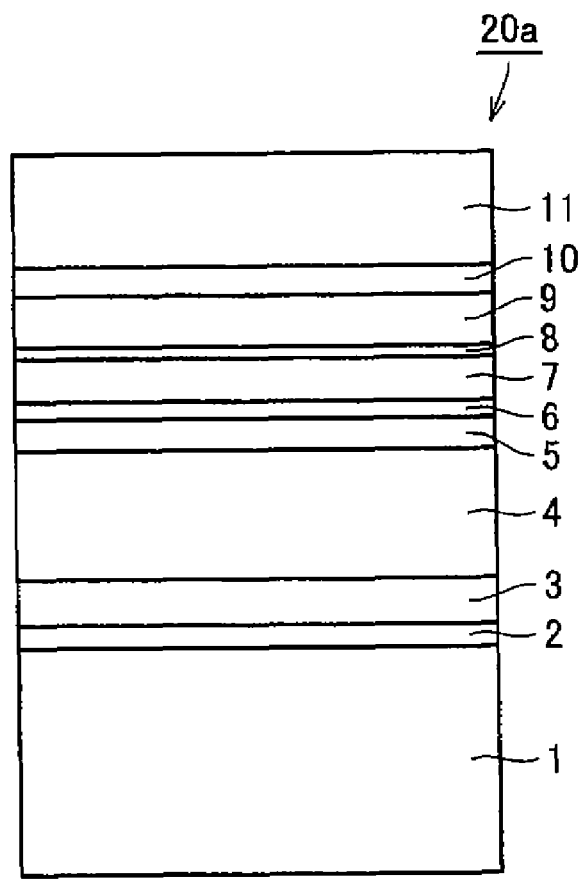

Next, as shown in a schematic cross sectional view of FIG. 3, on the first p-type semiconductor layer 7, the following layers are stacked in an order described below by means of, for example, sputtering: p-side ohmic electrode layer 8 with a thickness of, for example, 3.5 nm; reflective layer 9 with a thickness of, for example, 300 nm; and barrier layer 10 with a thickness of, for example, 100 nm. Then, the second bonding metal layer 11 is deposited on barrier layer 10 by vacuum evaporation to have a thickness of, for example, 3 μm.

Thereby, a first wafer 20a having buffer layer 2, nitride semiconductor layer 3, n-type semiconductor layer 4, light emitting layer 5, the second p-type semiconductor layer 6, the first p-type semiconductor layer 7, p-side ohmic electrode layer 8, reflective layer 9, barrier layer 10, and the second bonding metal layer 11 stacked in this order on sapphire substrate 1 is fabricated.

Figure 4:
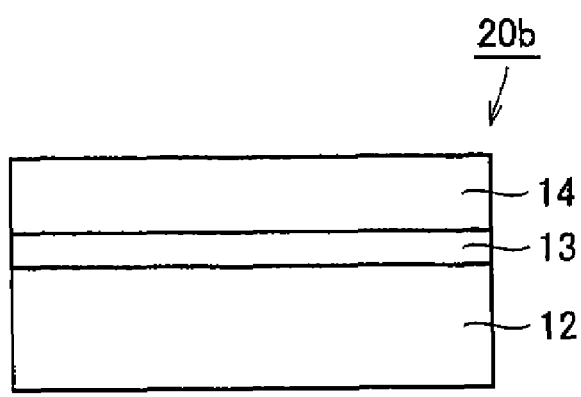

In addition, as shown in a schematic cross sectional view of FIG. 4, conductive substrate 12 is prepared, and a Ti layer with a thickness of, for example, 50 nm and an Au layer with a thickness of, for example, 500 nm are deposited in this order on conductive substrate 12 by vacuum evaporation to form the second ohmic electrode layer 13. Then, the first bonding metal layer 14 is deposited on the second ohmic electrode layer 13 by vacuum evaporation to have a thickness of, for example, 3 μm.

Thereby, a second wafer 20b having the second ohmic electrode layer 13 and the first bonding metal layer 14 stacked in this order on conductive substrate 12 is fabricated.

Figure 5:
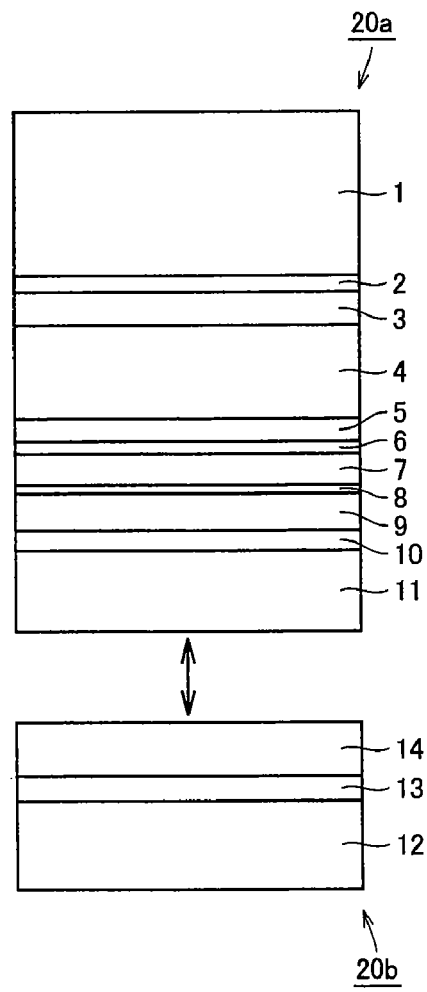

Subsequently, as shown in a schematic cross sectional view of FIG. 5, the second bonding metal layer 11 of the first wafer 20a and the first bonding metal layer 14 of the second wafer 20b are set to face each other, and bonded by eutectic bonding performed in a vacuum atmosphere under conditions of a temperature of 300° C. and a pressure of 300 N/cm$^2$. Thereby, a wafer bonded body of the first wafer 20a and the second wafer 20b is fabricated.

Figure 6:
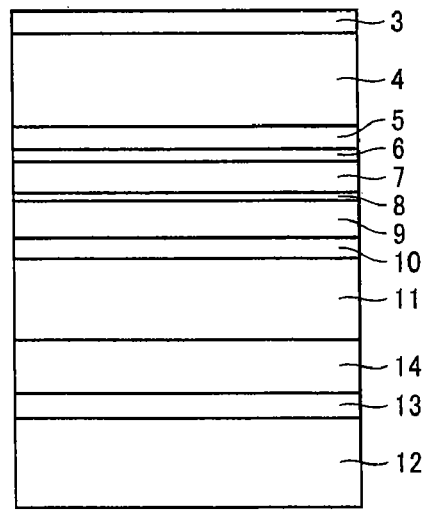

Thereafter, as shown in a schematic cross sectional view of FIG. 6, sapphire substrate 1 and buffer layer 2 are removed. The removal of sapphire substrate 1 and buffer layer 2 can be performed by applying YAG-THG laser light (with a wavelength of 355 nm) from a side adjacent to a rear surface of sapphire substrate 1 subjected to mirror polishing, and thermally decomposing sapphire substrate 1, buffer layer 2, and a portion of nitride semiconductor layer 3.

Figure 7:
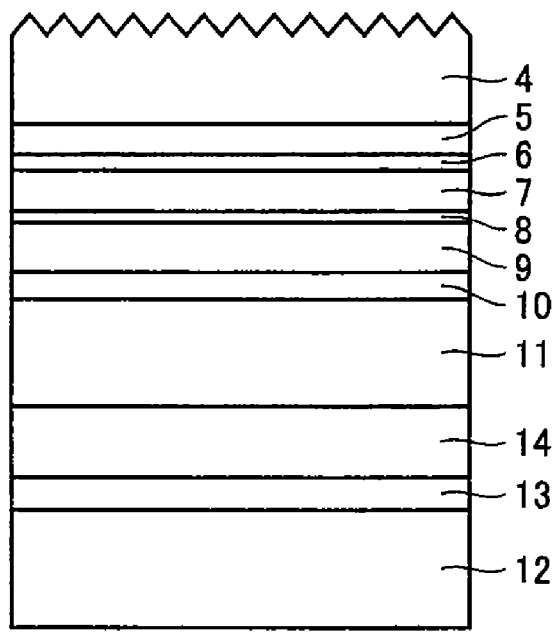

Subsequently, as shown in a schematic cross sectional view of FIG. 7, a surface of nitride semiconductor layer 3 exposed after the removal of sapphire substrate 1 and a surface of n-type semiconductor layer 4 are subjected to dry etching to form unevenness on the surface of n-type semiconductor layer 4. On this occasion, dry etching is performed until nitride semiconductor layer 3 is completely removed. By forming unevenness on the surface of n-type semiconductor layer 4, which will serve as a main light extracting surface, light extraction efficiency is improved.

Next, a resist pattern in which resists each having the shape of a square 300 μm on a side are arranged in a grid pattern at a pitch of 350 μm (that is, an interval between adjacent square resists is 50 μm) is formed on the surface of n-type semiconductor layer 4, using photolithography.

Figure 8:
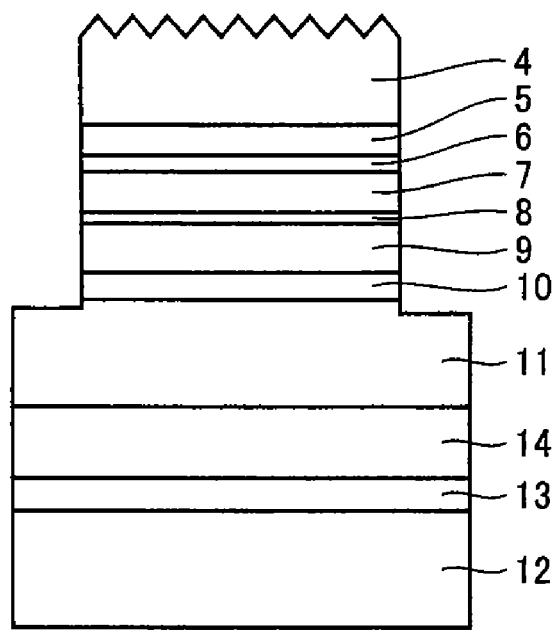

Then, as shown in a schematic cross sectional view of FIG. 8, n-type semiconductor layer 4, light emitting layer 5, the second p-type semiconductor layer 6, the first p-type semiconductor layer 7, p-side ohmic electrode layer 8, reflective layer 9, barrier layer 10, and a portion of the second bonding metal layer 11 placed between the square resists described above are removed by dry etching to form a trench. The trench is formed to have a depth that allows the portion of the second bonding metal layer 11 to be subjected to dry etching. Dry etching can be performed, for example, by physically and/or chemically etching the semiconductor layers (n-type semiconductor layer 4, light emitting layer 5, the second p-type semiconductor layer 6, and the first p-type semiconductor layer 7) and the metal layers (p-side ohmic electrode layer 8, reflective layer 9, barrier layer 10, and the second bonding metal layer 11), using an etching gas.

On this occasion, in a case where reflective layer 9 is made of Ag or an alloy containing Ag, Ag migration may occur and Ag may grow into whiskers or pillars when dry etching reaches reflective layer 9, which may cause a short circuit between the n-type semiconductor layer and the p-type semiconductor layers. Therefore, it is preferable to perform ultrasonic cleaning after the dry etching for forming the trench described above. Thereby, Ag that has grown into whiskers or pillars can be removed. Further, when the dry etching for forming the trench described above is divided into a plurality of dry etching steps and performed, it is preferable to perform ultrasonic cleaning after each dry etching step. Ultrasonic cleaning can be performed, for example, by immersing the wafer bonded body of the first wafer 20a and the second wafer 20b in a cleaning liquid and then applying an ultrasonic wave to the cleaning liquid.

Through the above dry etching, the trenches are formed in a grid pattern on a surface of the wafer bonded body of the first wafer 20a and the second wafer 20b. After the trenches are formed, the resists constituting the resist pattern described above are removed.

Further, the dry etching for forming the trench described above reaches the metal layers (p-side ohmic electrode layer 8, reflective layer 9, barrier layer 10, and the second bonding metal layer 11) below the semiconductor layers (n-type semiconductor layer 4, light emitting layer 5, the second p-type semiconductor layer 6, and the first p-type semiconductor layer 7). Thereby, metal splashes caused by the dry etching described above may adhere to the side surfaces of the semiconductor layers described above, and cause a short circuit between the n-type semiconductor layer and the p-type semiconductor layers.

Therefore, a rinsing treatment by wet etching is performed by immersing the side surfaces of the semiconductor layers described above in etchants capable of etching the respective metal layers described above.

For example, in a case where p-side ohmic electrode layer 8 is made of Pd or an alloy containing Pd, it is preferable to use a mixed solution of hydrochloric acid and water as an etchant for etching p-side ohmic electrode layer 8. Therefore, splashes of p-side ohmic electrode layer 8 adhering to the side surfaces of the semiconductor layers described above can be removed, for example, by immersing the side surfaces of the semiconductor layers described above in a first etchant formed of a mixed solution of hydrochloric acid and water, at room temperature for one minute.

It is to be noted that, in the case where p-side ohmic electrode layer 8 is made of Pd or an alloy containing Pd, there is a tendency that p-side ohmic electrode layer 8 can establish good ohmic contact with the p-type semiconductor layers.

Further, in a case where reflective layer 9 is made of Ag or an alloy containing Ag, it is preferable to use a mixed solution of a phosphoric acid aqueous solution, a nitric acid aqueous solution, an acetic acid aqueous solution, and water as an etchant for etching reflective layer 9. Therefore, splashes of reflective layer 9 adhering to the side surfaces of the semiconductor layers described above can be removed, for example, by immersing the side surfaces of the semiconductor layers described above in a second etchant formed of a mixed solution containing a phosphoric acid aqueous solution, a nitric acid aqueous solution, an acetic acid aqueous solution, and water in a mass ratio of 50:5:40:5, at room temperature for one minute.

It is to be noted that, in the case where reflective layer 9 is made of Ag or an alloy containing Ag, there is a tendency that, when light emitting layer 5 emits blue light having a wavelength in a blue band (for example, a wavelength of not less than 430 nm and not more than 490 nm), the blue light is highly likely to be reflected at reflective layer 9.

Further, in a case where barrier layer 10 is made of Ni or an alloy containing Ni, it is preferable to use hydrochloric acid, sulfuric acid, or a nitric acid aqueous solution as an etchant for etching barrier layer 10. Therefore, splashes of barrier layer 10 adhering to the side surfaces of the semiconductor layers described above can be removed, for example, by immersing the side surfaces of the semiconductor layers described above in the first etchant containing concentrated hydrochloric acid, at room temperature for one minute.

It is to be noted that, in the case where barrier layer 10 is made of Ni or an alloy containing Ni, the effect of being able to suppress interdiffusion of atoms between reflective layer 9 and the second bonding metal layer 11 sandwiching barrier layer 10 is increased.

Further, in a case where the second bonding metal layer 11 is made of Au or an alloy containing Au, it is preferable to use a mixed solution of iodine, potassium iodide, an organic solvent, and water as an etchant for etching the second bonding metal layer 11. Therefore, splashes of the second bonding metal layer 11 adhering to the side surfaces of the semiconductor layers described above can be removed, for example, by immersing the side surfaces of the semiconductor layers described above in a third etchant formed of a mixed solution containing iodine, potassium iodide, ethanol, and water in a mass ratio of 1:3:40:56, at room temperature for five minutes.

It is to be noted that, in the case where the first bonding metal layer 14 and the second bonding metal layer 11 are made of Au or an alloy containing Au, the first bonding metal layer 14 and the second bonding metal layer 11 tend to be bonded more strongly, and electrical resistance tends to become lower.

Consequently, there is a tendency that metal splashes adhering to the side surfaces of the semiconductor layers described above can effectively be removed, for example, by sequentially immersing the side surfaces of the semiconductor layers described above in the first etchant, the second etchant, and the third etchant described above. It is needless to say that the order of immersion in the first etchant, the second etchant, and the third etchant is not specifically limited.

Figure 9:
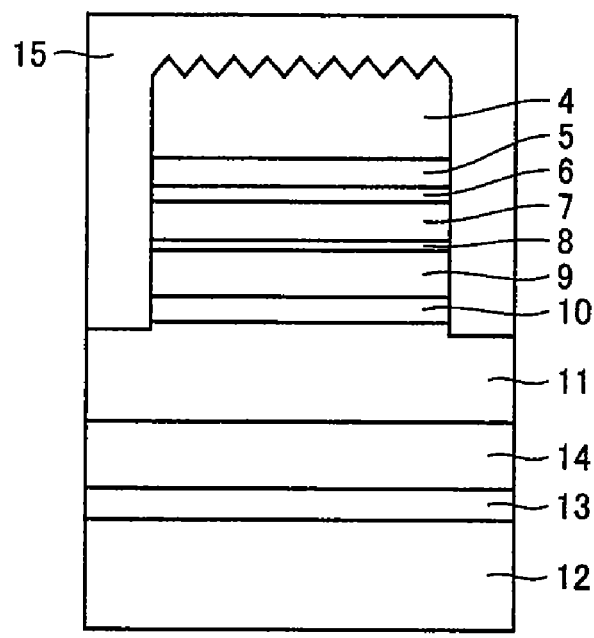

Next, as shown in a schematic cross sectional view of FIG. 9, insulating film 15 made of, for example, $SiO_2$ is formed all over the surfaces of the wafer bonded body on a side adjacent to n-type semiconductor layer 4, by means of, for example, plasma CVD. By the formation of insulating film 15, the side surfaces of the semiconductor layers described above subjected to the wet etching described above can be protected from contamination.

Figure 10:
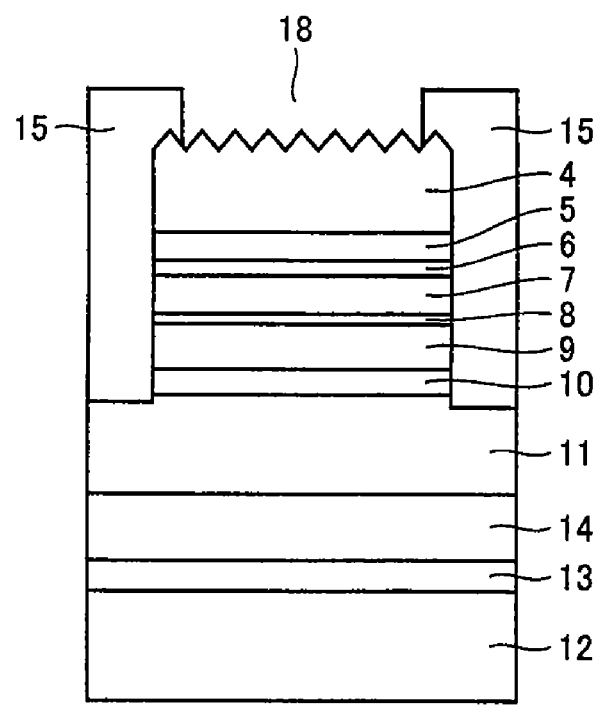

Subsequently, as shown in a schematic cross sectional view of FIG. 10, photoetching is performed to remove a portion of isolating film 15 in the shape of a square 290 μm on a side having a center identical to that of the resist in the shape of the square 300 μm on a side described above, and form opening 18 for extracting light in insulating film 15. Since the formation of opening 18 for extracting light can suppress light emitted from light emitting layer 5 from being absorbed by insulating film 15, light extraction efficiency is improved.

Figure 11:
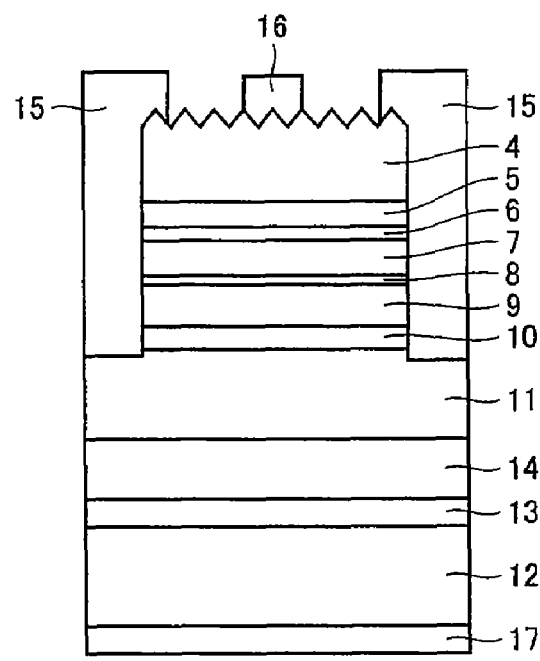
Figure 12:
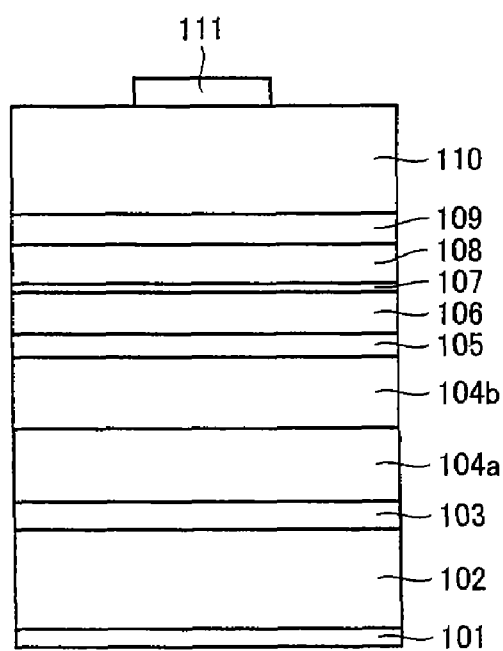
FIG. 12 is a schematic cross sectional view of an exemplary conventional semiconductor light emitting element having a conductive substrate attached to a semiconductor layered body.

Next, as shown in a schematic cross sectional view of FIG. 11, using photolithography and a lift-off process, n-side ohmic electrode layer 16 having a Ti layer with a thickness of, for example, 15 nm and an Au layer with a thickness of, for example, 500 nm stacked sequentially is formed near the center of the surface of n-type semiconductor layer 4. Further, the first ohmic electrode layer 17 having a Ti layer with a thickness of, for example, 15 nm, an Al layer with a thickness of, for example, 150 nm, and a Ti layer with a thickness of, for example, 15 nm stacked sequentially is formed on the rear surface of conductive substrate 12.

Finally, the wafer bonded body described above is cut at a position corresponding to the position where the above trench is formed and divided into chips, and thus the nitride semiconductor light emitting diode element shown in FIG. 1 is obtained. The wafer bonded body described above can be cut by, for example, diamond scribing, laser scribing, dicing, or the like.

In the nitride semiconductor light emitting diode element shown in FIG. 1 obtained as described above, even when sapphire substrate 1 as a growth substrate and conductive substrate 12 are formed of materials different from each other, the outer peripheries of n-type semiconductor layer 4, light emitting layer 5, the second p-type semiconductor layer 6, and the first p-type semiconductor layer 7 are each removed after the first bonding metal layer 14 and the second bonding metal layer 11 are bonded, and thus distortion of these semiconductor layers is alleviated by the presence of this removed portion.

Thereby, in the nitride semiconductor light emitting diode element shown in FIG. 1, delamination of the semiconductor layers due to the distortion of the semiconductor layers caused when the wafer bonded body is divided into chips can be suppressed, and thus yield is improved.

Further, in the nitride semiconductor light emitting diode element shown in FIG. 1, the side surfaces of n-type semiconductor layer 4, light emitting layer 5, the second p-type semiconductor layer 6, and the first p-type semiconductor layer 7 are subjected to wet etching after the formation of the trench by the dry etching described above, and metal splashes adhering to the side surfaces of these semiconductor layers can be removed. Thereby, a short circuit that may be caused between the n-type semiconductor layer and the p-type semiconductor layers can be suppressed.

Further, in the nitride semiconductor light emitting diode element shown in FIG. 1, the insulating film is formed on the side surfaces of the semiconductor layers described above after the wet etching described above, and thus a short circuit that may be caused between the n-type semiconductor layer and the p-type semiconductor layers can be suppressed. Thereby, stable current and voltage characteristics can be obtained.

Further, in the nitride semiconductor light emitting diode element shown in FIG. 1, in a case where Ag having high reflectivity in the blue wavelength band or an alloy containing such Ag is used for reflective layer 9, Ag whiskers or pillars generated by the dry etching for forming the trench described above can be removed by combining the dry etching with ultrasonic cleaning. Thereby, a short circuit that may be caused between the n-type semiconductor layer and the p-type semiconductor layers can be suppressed.

Further, in the nitride semiconductor light emitting diode element shown in FIG. 1, it is preferable that an area $S_1$ of the removed portion where the outer peripheries of the semiconductor layers described above are removed is not less than 1% and not more than 50% of an area $S_0$ of the surface of conductive substrate 12. When area $S_1$ is less than 1% of area $S_0$, there is a tendency that the effect of reducing distortion of the semiconductor layers described above achieved by the above removed portion cannot be fully obtained. When area $S_1$ is more than 50% of area $S_0$, the amount of light emission is significantly reduced, and thus light extraction efficiency tends to be significantly reduced. Herein, area $S_1$ means an entire area of the frame-like removed portion of the semiconductor layers described above.

Further, in the nitride semiconductor light emitting diode element shown in FIG. 1, it is preferable that an area $S_2$ of opening 18 for extracting light in insulating film 15 is not less than 50% and not more than 99% of area $S_0$ of the surface of conductive substrate 12. When area $S_2$ is less than 50% of area $S_0$, there is a tendency that light emitted from light emitting layer 5 is absorbed by insulating film 15 and thus light extraction efficiency cannot be improved significantly. When area $S_2$ is more than 99% of area $S_0$, insulating film 15 tends to be delaminated from the semiconductor layers described above.

The semiconductor light emitting element of the present invention has a possibility to be suitably applicable, for example, to a nitride semiconductor light emitting diode or the like emitting blue light having a wavelength of not less than 430 nm and not more than 490 nm.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method of manufacturing a semiconductor light emitting element comprising a conductive substrate, a bonding metal layer formed on said conductive substrate, a barrier layer formed on said bonding metal layer, a reflective layer formed on said barrier layer, an ohmic electrode layer formed on said reflective layer, a second conductivity type semiconductor layer formed on said ohmic electrode layer, a light emitting layer formed on said second conductivity type semiconductor layer, and a first conductivity type semiconductor layer formed on said light emitting layer, the method comprising:

removing outer peripheries of said second conductivity type semiconductor layer, said light emitting layer, and said first conductivity type semiconductor layer by dry etching; and immersing in an etchant surfaces exposed by said dry etching of said second conductivity type semiconductor layer, said light emitting layer and said first conductivity type semiconductor layer.

2. A method of manufacturing a semiconductor light emitting element comprising a conductive substrate, a bonding metal layer formed on said conductive substrate, a barrier layer formed on said bonding metal layer, a reflective layer formed on said barrier layer, an ohmic electrode layer formed on said reflective layer, a second conductivity type semiconductor layer formed on said ohmic electrode layer, a light emitting layer formed on said second conductivity type semiconductor layer, and a first conductivity type semiconductor layer formed on said light emitting layer, the method comprising:

removing outer peripheries of said second conductivity type semiconductor layer, said light emitting layer, and said first conductivity type semiconductor layer by dry etching; and performing ultrasonic cleaning after said dry etching when said reflective layer is made of silver or an alloy containing silver.

3. The method of manufacturing the semiconductor light emitting element according to claim 1, further comprising:

forming an insulating film on the surfaces of said second conductivity type semiconductor layer, said light emitting layer, and said first conductivity type semiconductor layer after the immersing in said etchant.

4. The method of manufacturing the semiconductor light emitting element according to claim 1, wherein said etchant is formed of a material that can etch at least one type selected from a group consisting of said bonding metal layer, said barrier layer, said reflective layer, and said ohmic electrode layer.

5. The method of manufacturing the semiconductor light emitting element according to claim 4, wherein when said bonding metal layer is made of gold or an alloy containing gold, said etchant is formed of a mixed solution of iodine, potassium iodide, an organic solvent, and water.

6. The method of manufacturing the semiconductor light emitting element according to claim 4, wherein when said barrier layer is made of nickel or an alloy containing nickel, said etchant is formed of hydrochloric acid, sulfuric acid, or a nitric acid aqueous solution.

7. The method of manufacturing the semiconductor light emitting element according to claim 4, wherein when said reflective layer is made of silver or an alloy containing silver, said etchant is formed of a mixed solution of a phosphoric acid aqueous solution, a nitric acid aqueous solution, an acetic acid aqueous solution, and water.

8. The method of manufacturing the semiconductor light emitting element according to claim 4, wherein when said ohmic electrode layer is made of palladium or an alloy containing palladium, said etchant is formed of a mixed solution of hydrochloric acid and water.

* * * * *